(12) United States Patent
Kim et al.

(10) Patent No.: US 9,819,322 B2
(45) Date of Patent: Nov. 14, 2017

(54) WIRELESS COMMUNICATION DEVICE AND METHOD OF OPERATING THE SAME

(71) Applicant: SAMSUNG ELECTRONICS CO., LTD., Suwon-si, Gyeonggi-Do (KR)

(72) Inventors: Huijung Kim, Hwaseong-si (KR); Sanghoon Kang, Incheon (KR); Sooyong Kim, Yongin-si (KR); Chaehag Yi, Seongnam-si (KR); Hyeongseok Jeong, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/523,982

(22) Filed: Oct. 27, 2014

(65) Prior Publication Data
US 2017/0105184 A1   Apr. 13, 2017
US 2017/0289930 A9   Oct. 5, 2017

(30) Foreign Application Priority Data

Nov. 14, 2013  (KR) .................. 10-2013-0138416

(51) Int. Cl.
*H04B 1/10* (2006.01)
*H03G 3/30* (2006.01)
*H03F 3/19* (2006.01)
*H03F 3/72* (2006.01)
*H04B 1/26* (2006.01)

(52) U.S. Cl.
CPC .............. *H03G 3/3036* (2013.01); *H03F 3/19* (2013.01); *H03F 3/72* (2013.01); *H03F 2200/294* (2013.01); *H03F 2200/451* (2013.01); *H03F 2203/7231* (2013.01); *H03F 2203/7239* (2013.01)

(58) Field of Classification Search
CPC ......... H04W 52/12; H04W 88/06; H03F 3/19; H03F 2200/194; H03F 2200/451; H03G 3/3036
USPC .......................................... 455/296, 303, 306
See application file for complete search history.

(56) References Cited

U.S. PATENT DOCUMENTS

| | | |
|---|---|---|
| 7,010,330 B1 | 3/2006 | Tsividis |
| 7,020,449 B2 | 3/2006 | Shi |
| 7,151,915 B2 | 12/2006 | Heinonen et al. |
| 7,269,144 B2 | 9/2007 | Gardenfors et al. |

(Continued)

*Primary Examiner* — Lee Nguyen
(74) *Attorney, Agent, or Firm* — Volentine & Whitt, PLLC (57) ABSTRACT

A method is provided for operating a radio frequency (RF) receiver including a transimpedance amplifier, a capacitor selectively connected in parallel with the transimpedance amplifier, a channel selection filter unit connected to an output terminal of the transimpedance amplifier, and a variable gain amplification unit selectively connected in parallel with the channel selection filter unit. The method includes measuring signal-to-noise ratio from an output of the RF receiver, and comparing the measured signal-to-noise ratio with a reference signal-to-noise ratio. When the measured signal-to-noise ratio is greater than the reference signal-to-noise ratio, the capacitor is electrically disconnected from being connected in parallel with the transimpedance amplifier and a variation in the measured signal-to-noise ratio is measured. When the measured variation is in tolerance, the channel selection filter is bypassed to select the variable gain amplification unit.

20 Claims, 6 Drawing Sheets

(56) References Cited

U.S. PATENT DOCUMENTS

| | | |
|---|---|---|
| 7,512,392 B2 | 3/2009 | Millard et al. |
| 7,532,867 B1 | 5/2009 | Mo et al. |
| 8,131,251 B2 | 3/2012 | Burgener et al. |
| 8,260,212 B2 | 9/2012 | Chien |
| 8,364,106 B2 | 1/2013 | Behzad |
| 8,412,118 B2 | 4/2013 | Ojo et al. |
| 8,428,526 B2 | 4/2013 | Wang et al. |
| 8,457,580 B2 | 6/2013 | Mikhemar et al. |
| 2008/0100374 A1* | 5/2008 | Papananos ......... H03H 11/1291 327/553 |
| 2009/0215420 A1 | 8/2009 | Mendoza et al. |
| 2010/0062726 A1 | 3/2010 | Zheng et al. |
| 2012/0183096 A1 | 7/2012 | Le Naour et al. |
| 2012/0322394 A1 | 12/2012 | Chien |

* cited by examiner

WIRELESS COMMUNICATION DEVICE AND METHOD OF OPERATING THE SAME

CROSS-REFERENCE TO RELATED APPLICATIONS

A claim for priority under 35 U.S.C. §119 is made to Korean Patent Application No. 10-2013-0138416, filed Nov. 14, 2013, in the Korean Intellectual Property Office, the entire contents of which are hereby incorporated by reference.

BACKGROUND

The inventive concept described herein relate to a method of operating a radio frequency (RF) receiver, and more particularly, to a method of reducing power consumption of the RF receiver.

In recent years, use of mobile devices (e.g., smart phones, tablet personal computers (PCs), etc.) has been increasing. Such high-performance and small-sized mobile devices, for example, require appropriate power management. The mobile devices may communicate using communication specifications, such as Wi-Fi, Long Term Evolution (LTE), and the like.

For communication with another terminal or for connecting to the Internet, a radio frequency (RF) receiver of a mobile device may perform a variety of operations, including filtering and amplifying an input signal. Since interference and noise filtering operations of a channel selection filter of the RF receiver, in particular, requires large currents, the RF receiver may consume a significant amount of power.

That the channel selection filter operates when the communication environment is good (e.g., when measured signal-to-noise ratio is above a signal-to-noise ratio threshold needed by the system) may be inefficient in terms of power management of the mobile device. Thus, there is a method is needed for reducing power consumption of the RF receiver.

SUMMARY

One aspect the inventive concept provides a method of operating a radio frequency (RF) receiver including a transimpedance amplifier, a capacitor selectively connected in parallel with the transimpedance amplifier, a channel selection filter unit connected to an output terminal of the transimpedance amplifier, and a variable gain amplification unit selectively connected in parallel with the channel selection filter unit. The method includes measuring signal-to-noise ratio from an output of the RF receiver, and comparing the measured signal-to-noise ratio with a reference signal-to-noise ratio. When the measured signal-to-noise ratio is greater than the reference signal-to-noise ratio, the capacitor is electrically disconnected from being connected in parallel with the transimpedance amplifier and a variation in the measured signal-to-noise ratio is measured. When the measured variation is in tolerance, the channel selection filter is bypassed to select the variable gain amplification unit.

The method may further include amplifying an output signal of the variable gain amplification unit using an auxiliary variable gain amplifier when the channel selection filter unit is bypassed. Also, the method may further include comparing the measured signal-to-noise ratio with the reference signal-to-noise ratio when the channel selection filter unit is bypassed. When the signal-to-noise ratio measured when the channel selection filter unit is bypassed is less than the reference signal-to-noise ratio, the capacitor may be connected to be in parallel with the transimpedance amplifier and the channel selection filter unit may be prevented from being bypassed.

The method may further include connecting the capacitor to be in parallel with the transimpedance amplifier when the variation is not in tolerance.

The channel selection filter unit may include first to nth channel selection filters (n being a natural number) and the variable gain amplification unit may first to nth variable gain amplifiers. Output terminals of an ith channel selection filter and an ith variable gain amplifier (i being a natural number greater than or equal to 1 and less than n) may be respectively connected to input terminals of a (i+1)th channel selection filter and a (i+1)th variable gain amplifier. When the channel selection filter unit is bypassed, a bypass operation may be performed from the first variable gain amplifier to the nth variable gain amplifier in an inverse order.

The channel selection filter unit may include a channel selection filter and the variable gain amplification unit may include first to nth variable gain amplifiers (n being a natural number). An output terminal of an ith variable gain amplifier (i being a natural number greater than or equal to 1 and less than n) may be connected to an input terminal of a (i+1)th variable gain amplifier. Also, the channel selection filter unit may include first to nth channel selection filters (n being a natural number) and the variable gain amplification unit may include a variable gain amplifier. An output terminal of an ith channel selection filter variable (i being a natural number greater than or equal to 1 and less than n) may be connected to an input terminal of an (i+1)th channel selection filter.

Bypassing the channel selection filter unit may be performed in response to a control signal from a modem connected to an output terminal of the RF receiver. Electrically disconnecting the capacitor from being connected in parallel with the transimpedance amplifier may be performed in response to a control signal from a modem connected to an output terminal of the RF receiver.

Another aspect of the inventive concept provides a wireless communication device including a transimpedance amplifier configured to convert a current signal into a voltage signal; a capacitor selectively connected in parallel with the transimpedance amplifier; a channel selection filter unit configured to filter the voltage signal from the transimpedance amplifier; a variable gain amplification unit selectively connected in parallel with the channel selection filter unit; and a modem connected to an output terminal of the channel selection filter unit or to an output terminal of the variable gain amplification unit to measure signal-to-noise ratio. The modem generates a first control signal for electrically disconnecting the capacitor from the transimpedance amplifier when the signal-to-noise ratio is greater than a reference signal-to-noise ratio and a second control signal for bypassing the channel selection filter unit when a variation in the signal-to-noise ratio is within a predetermined range.

The wireless communication device may further include an auxiliary variable gain amplifier connected between the channel selection filter unit and the modem. The auxiliary variable gain amplifier may be configured to amplify an output of the variable gain amplification unit when a variation in the signal-to-noise ratio is within the predetermined range.

The wireless communication device may further include a switch connected to the capacitor and configured to be turned on or off under control of the first control signal. The capacitor may be electrically connected in parallel to the transimpedance amplifier when the switch is turned on and may be electrically disconnected from the transimpedance amplifier when the switch is turned off.

The channel selection filter unit may include first to nth channel selection filters (n being a natural number) and the variable gain amplification unit may include first to nth variable gain amplifiers. Output terminals of an ith channel selection filter and an ith variable gain amplifier (i being a natural number greater than or equal to 1 and less than n) may be respectively connected to input terminals of an (i+1)th channel selection filter and an (i+1)th variable gain amplifier, respectively.

The channel selection filter unit may include a channel selection filter and the variable gain amplification unit may include first to nth variable gain amplifiers (n being a natural number). An output terminal of an ith variable gain amplifier (i being a natural number greater than or equal to 1 and less than n) may be connected to an input terminal of a (i+1)th variable gain amplifier. Also, the channel selection filter unit may include first to nth channel selection filters (n being a natural number) and the variable gain amplification unit may include a variable gain amplifier. An output terminal of an ith channel selection filter variable (i being a natural number greater than or equal to 1 and less than n) may be connected to an input terminal of an (i+1)th channel selection filter.

Another aspect of the inventive concept provides an RF receiver of a wireless communication device configured to receive an RF input signal from a filter and to output a data signal to a modem. The RF receiver includes a transimpedance amplifier configured to convert a current signal from the RF input signal into a voltage signal; a capacitor connectable in parallel with the transimpedance amplifier via a first switch; a channel selection filter unit configured to filter the voltage signal from the transimpedance amplifier; and a variable gain amplification unit connectable in parallel with the channel selection filter unit via a second switch. The data signal is output from one of the channel selection filter unit or the variable gain amplification unit, enabling the modem to measure signal-to-noise ratio. The first switch receives a first control signal from the modem causing the first switch to electrically disconnect the capacitor from the transimpedance amplifier when the signal-to-noise ratio is greater than a reference signal-to-noise ratio, and the second switch receives a second control signal from the modem causing the channel selection filter unit to be bypassed when a variation in the signal-to-noise ratio is within a predetermined range.

The variation in the signal-to-noise ratio may be determined when the capacitor is not connected to the transimpedance amplifier. The RF receiver may further include an auxiliary variable gain amplifier configured to amplify an output of the variable gain amplification unit when the channel selection filter unit is bypassed.

BRIEF DESCRIPTION OF THE FIGURES

Exemplary embodiments of the inventive concept will become apparent from the following description with reference to the following figures, in which like reference numerals refer to like parts throughout the various figures unless otherwise specified, and in which.

DETAILED DESCRIPTION

Embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Accordingly, known processes, elements, and techniques are not described with respect to some of the embodiments. Unless otherwise noted, like reference numerals denote like elements throughout the attached drawings and written description, and thus descriptions may be repeated. In the drawings, sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
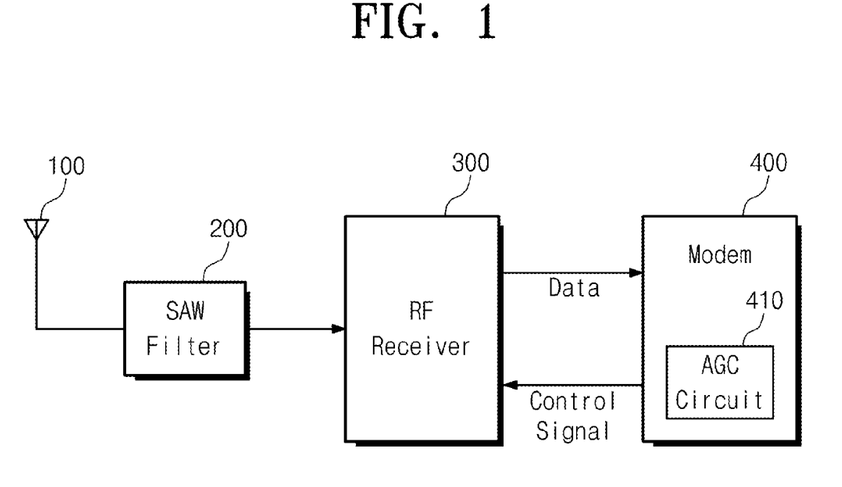
FIG. 1 is a block diagram schematically illustrating a wireless communication device, according to an embodiment of the inventive concept.

FIG. 1 is a block diagram schematically illustrating a wireless communication device, according to an embodiment of the inventive concept. Referring to FIG. 1, a wireless communication device includes an antenna 100, a surface acoustic wave (SAW) filter 200, an RF receiver 300, and a modem 400.

The antenna 100 is configured to receive wireless signals. Although an RF receiving device (RF receiver 300) is illustrated in FIG. 1, it is understood that the antenna 100 may also be connected to an RF transceiver for transmitting as well as receiving wireless signals.

The SAW filter 200 filters communications, for example, by converting electromagnetic waves into acoustic waves and passing only a wavelength of a target frequency. The SAW filter 200 may include a piezoelectric substrate made of a piezoelectric material to convert fast electromagnetic waves into slow acoustic waves. The SAW filter 200 also may remove an adjacent channel signal by controlling a signal frequency component and a phase component using a surface acoustic wave. The SAW filter 200 may be a band pass filter (BPF) that passes an input channel signal, for example.

The RF receiver 300 is configured to amplify, mix and filter input channel signals filtered by the SAW filter 200. A variety of data measured by the RF receiver 300 is sent to the modem 400 connected to an output terminal of the RF receiver 300. The RF receiver 300 may include a transimpedance amplifier TIA, a transimpedance amplifier capacitor $C_{TIA}$ selectively connected in parallel with the transimpedance amplifier TIA (via operation of a corresponding switch), a channel selection filter unit CSF connected to an output terminal of the transimpedance amplifier TIA, and a variable gain amplification unit VGA1 selectively connected in parallel with the channel selection filter unit CSF (via operation of a corresponding switch), as discussed below with reference to FIG. 2.

The modem 400 receives a data signal DATA from the RF receiver 300 and outputs control signals for controlling the RF receiver 300, in response to measurements of the data signal DATA. For example, the control signals may include a first control signal for operating a first switch to selectively cut off the electrical connection between the transimpedance amplifier capacitor $C_{TIA}$ and the transimpedance amplifier TIA, a second control signal for operating a second switch to selectively bypass the channel selection filter unit CSF, and a third control signal for operating a third switch to selectively bypass an auxiliary variable gain amplifier VGA2. Although not shown in FIG. 1, the first to third control signals may be generated by a controller connected to the modem 400.

The modem 400 includes an automatic gain control (AGC) circuit 410. The RF receiver 300 and the AGC circuit 410 may constitute an AGC loop. The AGC loop may operate as a closed loop to set the input signal DATA to the modem 400 to a target level. The modem 400 is configured to control gain of the RF receiver 300 in order to receive an input signal required by the modem 400. At this time, the modem 400 analyzes signal-to-noise ratio (SNR) of the input signal (e.g., input signal DATA) provided by the RF receiver 300 in real time. Under control of a control signal, the RF receiver 300 may measure a variation in the SNR when the electrical connection between the transimpedance amplifier capacitor $C_{TIA}$ and the transimpedance amplifier TIA is cut off. When the variation in the SNR is within tolerance (i.e., within a predetermined range), the RF receiver 300 may determine external interference to be allowable. Thus, current and power consumption of the RF receiver 300 may be reduced by bypassing the channel selection filter unit CSF and selecting the variable gain amplification unit VGA1, under control of a control signal.

Figure 2:
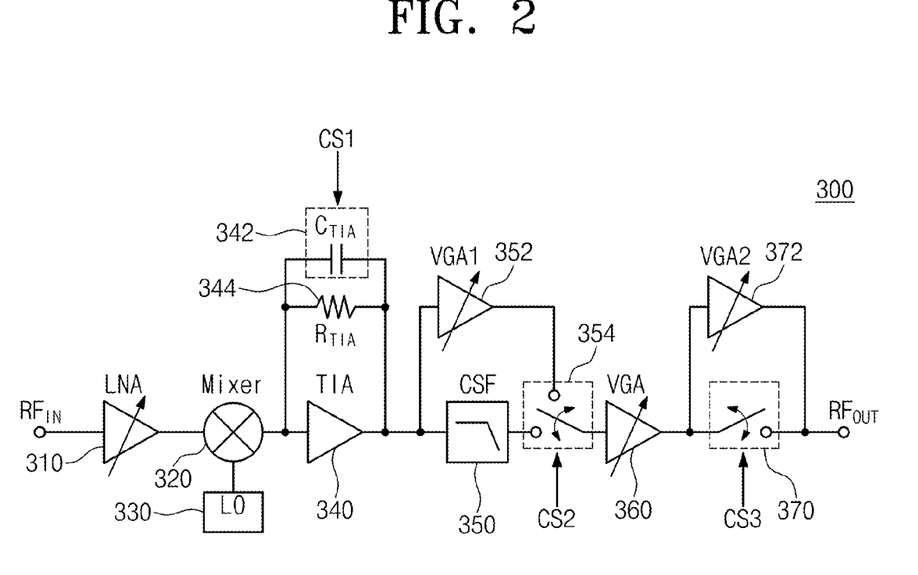
FIG. 2 is a circuit diagram schematically illustrating an RF receiver of a wireless communication device, according to an embodiment of the inventive concept.

FIG. 2 is a circuit diagram schematically illustrating the RF receiver 300 of a wireless communication device, according to an embodiment of the inventive concept. An RF signal filtered through a SAW filter 200 shown in FIG. 1 is provided to an input terminal $RF_{IN}$ of an RF receiver 300. A signal amplified, mixed and filtered by the RF receiver 300 and data for measuring SNR is output through an output terminal $RF_{OUT}$. A control signal for controlling the RF receiver 300 may be provided to the RF receiver 300 through the output terminal $RF_{OUT}$.

In the depicted embodiment, the RF receiver 300 includes a low noise amplifier (LNA) 310, a mixer 320, a local oscillator (LO) 330, a transimpedance amplifier (TIA) 340, a transimpedance amplifier capacitor ($C_{TIA}$) unit 342, a resistance 344, a channel selection filter unit (CSF) 350, a variable gain amplification unit (VGA1) 352, a switch 354, a (optional) variable gain amplifier 360, a switch 370, and an auxiliary variable gain amplifier (VGA2) 372.

The low noise amplifier 310 amplifies an input signal to a target level. The input signal may be amplified because the signal received through the antenna 110 shown in FIG. 1 has a low level, e.g., owing to influence of attenuation and noise. The low noise amplifier 320 may be formed of a transistor having a small noise figure (NF) and a resistive element (not shown). Gain of the low noise amplifier 320 may be variable.

The mixer 320 mixes the signal amplified by the low noise amplifier 310 and an LO signal generated by the local oscillator 330. In particular, the mixer 320 may multiply two sine wave signals to generate a signal having a target frequency. A signal from the mixer 320 has an intermediate frequency (IF), and may be referred to as an IF signal.

The transimpedance amplifier 340 converts the IF signal (or current signal) from the mixer 320 into a voltage signal. The transimpedance amplifier capacitor $C_{TIA}$ of the transimpedance amplifier capacitor unit 342 is selectively connected in parallel with the transimpedance amplifier 340. The resistance 344 is also connected in parallel with the transimpedance amplifier 340. Whether the communication environment of the wireless communication device is well established may be determined by measuring a variation in SNR measured when the electrical connection between the transimpedance amplifier capacitor unit 342 and the transimpedance amplifier 340 is cut off (e.g., when a switch connected to the transimpedance amplifier capacitor $C_{TIA}$ is off), as discussed below with reference to FIG. 3. For example, the SNR may be measured by analyzing data provided to the modem 400 (refer to FIG. 1) in real time, where the modem 400 analyzes the data.

The channel selection filter unit 350 receives a signal amplified by the transimpedance amplifier 340 and performs a filtering operation, such that a frequency of a target band is output. The channel selection filter unit 350 thus removes adjacent channel interference insufficiently removed in previous filtering step(s) (e.g., filtering by the SAW filter 200). For example, the channel selection filter unit 350 may be a low pass filter (LPF). The channel selection filter unit 350 may include one or more channel selection filters. The channel selection filter unit 350 may perform an amplification function as well as a filtering function.

The variable gain amplification unit 352 is connected in parallel with the channel selection filter unit 350. More particularly, the variable gain amplifier 350 may be connected between input and output terminals of the channel selection filter unit 350 to adjust the gain of the output signal of the transimpedance amplifier 340. For example, the channel selection filter unit 350 or the variable gain amplification unit 352 may be selected by the switch 354 which operates in response to a second control signal CS2. When the channel selection filter unit 350 is bypassed through operation of the switch 354, the variable gain amplification unit 352 is connected to an output terminal of the transimpedance amplifier 340 to amplify the output signal. The variable gain amplification unit 352 according to an embodiment of the inventive concept may include one or more variable gain amplifiers.

The variable gain amplifier 360 may be connected to an output terminal of the channel selection filter unit 350 or to an output terminal of the variable gain amplification unit VGA1, depending on the position of the switch 354.

The auxiliary variable gain amplifier 372 may be selected by operation of the switch 370, which operates in response to a third control signal CS3. For example, the third control signal CS3 may be generated by the modem 400 shown in FIG. 1 or from a controller (not shown) connected to the modem 400. When the channel selection filter unit 350 is bypassed, the auxiliary variable gain amplifier 372 may be connected to an output terminal of the variable gain amplification unit 352 through a turn-off operation (opening) of the switch 370. The auxiliary variable gain amplifier 372 compensates for gain generated by bypassing the channel selection filter unit 350. As illustrated in FIG. 2, the variable gain amplifier 360 is also connected between the variable gain amplification unit 352 and the auxiliary variable gain amplifier 372. When the auxiliary variable gain amplifier 372 is bypassed through a turn-on operation (closing) of the switch 370, the variable gain amplifier 360 may be connected to the output terminal of the channel selection filter unit 350 to amplify the output signal of the channel selection filter unit 350.

Figure 3:
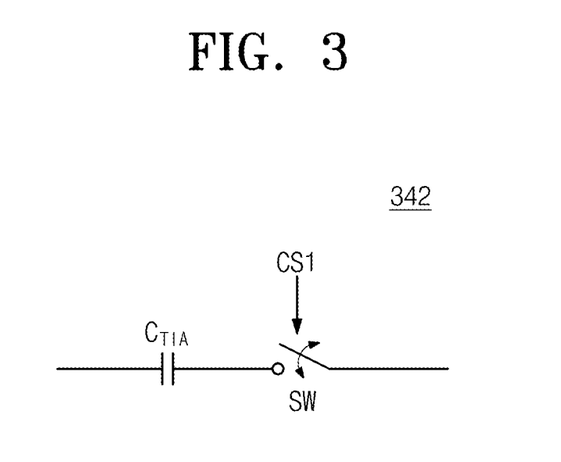
FIG. 3 is a diagram showing a method of operating a transimpedance amplifier capacitor shown in FIG. 2, according to an embodiment of the inventive concept.

FIG. 3 is a diagram showing a method of operating the transimpedance amplifier capacitor unit 342 shown in FIG. 2, according to an embodiment of the inventive concept. In the depicted embodiment, the transimpedance amplifier capacitor unit 342 includes the transimpedance amplifier capacitor $C_{TIA}$ connected in series with switch SW. When the switch SW is turned on or off by a first control signal CS1 received through the output terminal $RF_{OUT}$ of the RF receiver 300, the transimpedance amplifier capacitor $C_{TIA}$ is electrically connected to or disconnected from the transimpedance amplifier 340, respectively. For example, the first control signal CS1 may be generated from the modem 400 shown in FIG. 1 or from a controller (not shown) connected to the modem 400. Whether the communication environment of a wireless communication device is well established may be determined by measuring a variation in SNR when the switch SW is turned on or off. Since the transimpedance amplifier capacitor $C_{TIA}$ performs a filtering role, the communication environment may be determined to be good when variation of the SNR is less.

Figure 4:
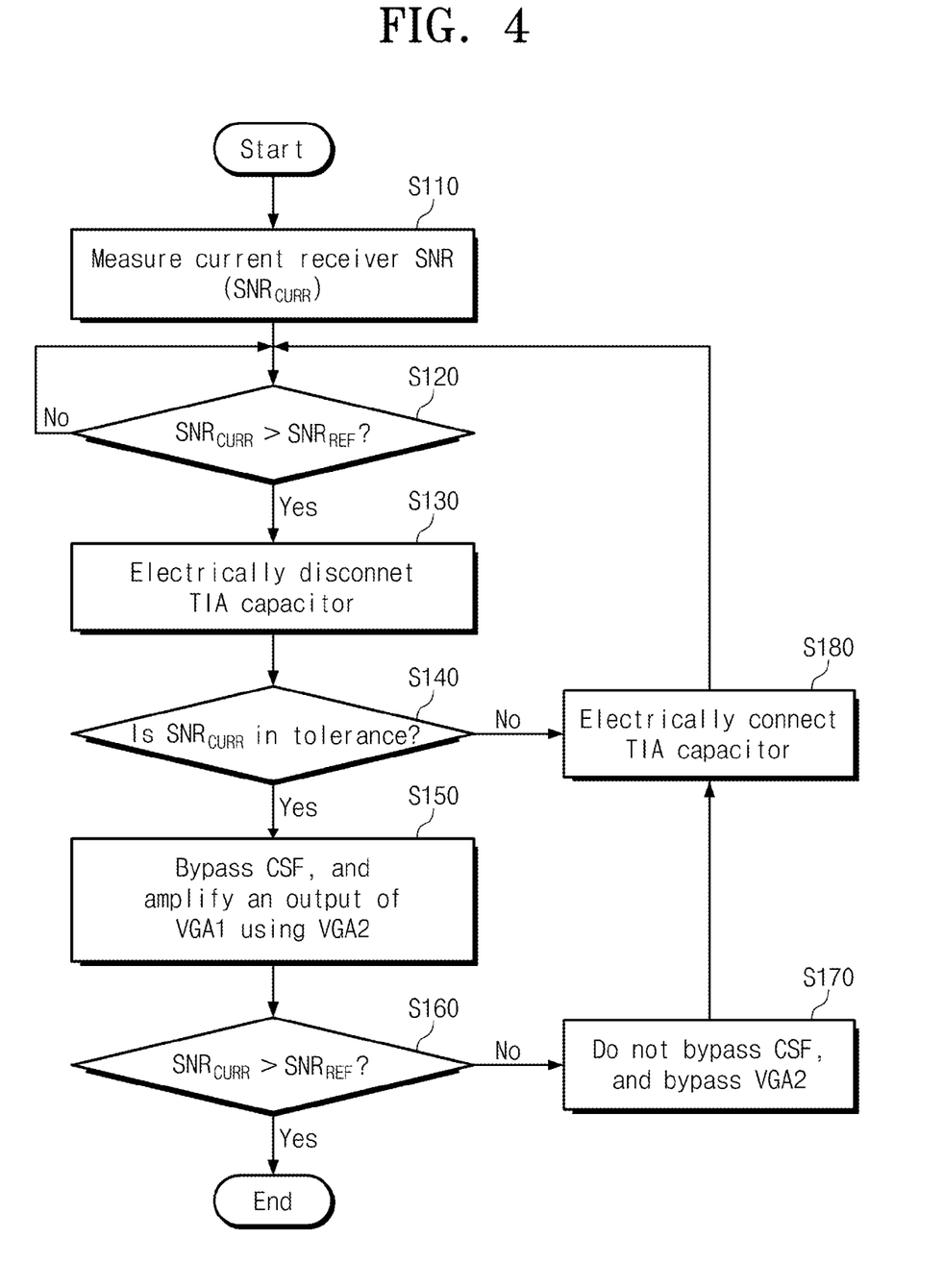
FIG. 4 is a flow chart schematically illustrating a method of operating an RF receiver, according to an embodiment of the inventive concept.

FIG. 4 is a flow chart schematically illustrating a method of operating an RF receiver, according to an embodiment of the inventive concept. A method of reducing power consumption of the RF receiver 300 (refer to FIG. 1) will be more fully described with reference to FIGS. 1 to 4.

Referring to FIG. 4, in step S110, a current signal-to-noise ratio $SNR_{CURR}$ of the RF receiver 300 (refer to FIG. 1) is measured. The modem 400 shown in FIG. 1 may include the AGC (Automatic Gain Control) circuit 410, as discussed above. The RF receiver 300 and the AGC circuit may constitute an AGC loop, which controls gain of the RF receiver 300 to adjust the input signal DATA of the modem 400 (refer to FIG. 1) to a target level. The modem 400 may analyze the signal-to-noise ratio $SNR_{CURR}$ of the input signal DATA in real time. The signal-to-noise ratio $SNR_{CURR}$ may be measured periodically in real time.

In step S120, the signal-to-noise ratio $SNR_{CURR}$ thus measured may be compared with a reference signal-to-noise ratio $SNR_{REF}$ required by the wireless communication device. For example, such comparison may be performed by the modem 400 or by a controller (not shown) connected to the modem 400. The operation diverges according to whether the signal-to-noise ratio $SNR_{CURR}$ thus measured is greater than the reference signal-to-noise ratio $SNR_{REF}$, as determined in step S120. For example, when the signal-to-noise ratio $SNR_{CURR}$ thus measured is less than the reference signal-to-noise ratio $SNR_{REF}$ (step S120: No), it generally means that a large amount of noise may be included in the input signal. In this case, the communication environment may be determined to be poor, and step S120 is repeated until the communication environment improves (e.g., until the signal-to-noise ratio $SNR_{CURR}$ thus measured becomes greater than the reference signal-to-noise ratio $SNR_{REF}$ at step S120). When the signal-to-noise ratio $SNR_{CURR}$ thus measured is greater than the reference signal-to-noise ratio $SNR_{REF}$ (step S120: Yes), the method proceeds to step S130.

In step S130, transimpedance amplifier capacitor $C_{TIA}$ in transimpedance amplifier capacitor unit 342 (refer to FIG. 2) is electrically disconnected from the transimpedance amplifier 340 (refer to FIG. 2). That is, when the signal-to-noise ratio $SNR_{CURR}$ thus measured is greater than the reference signal-to-noise ratio $SNR_{REF}$, the transimpedance amplifier capacitor $C_{TIA}$ may be bypassed. This action enables determination of whether the communication environment is good based on a measured variation of the signal-to-noise ratio $SNR_{CURR}$. For example, electrical disconnection between the transimpedance amplifier capacitor $C_{TIA}$ and the transimpedance amplifier 340 may be accomplished by an on-off operation of a switch SW which is controlled by a first control signal CS1 as illustrated in FIG. 3. For example, the first control signal CS1 may be generated from the modem 400 or from a controller (not shown) connected to the modem 400.

In step S140, it is determined whether a variation in the signal-to-noise ratio $SNR_{CURR}$ in response to cutting off connection between the transimpedance amplifier capacitor $C_{TIA}$ and the transimpedance amplifier 340 (in step S130) is within tolerance. In general, the transimpedance amplifier capacitor $C_{TIA}$ connected to the transimpedance amplifier 340 may absorb noise. Thus, when the transimpedance amplifier capacitor $C_{TIA}$ is bypassed, interference or noise of the RF receiver 300 may increase. However, when the variation in the signal-to-noise ratio $SNR_{CURR}$ is small when the transimpedance amplifier capacitor $C_{TIA}$ is bypassed, that is, when the variation is within tolerance, the communication environment is determined to be satisfied. The reason is that there is little external interference. The operation may therefore diverge according to whether variation in the measured $SNR_{CURR}$ is within tolerance. As a consequence of determining that the variation in the measured $SNR_{CURR}$ is in tolerance (step S140: Yes), the method proceeds to step S150. As a consequence of determining that the variation in the measured $SNR_{CURR}$ is not in tolerance (step S140: No), the method proceeds to step S180.

In step S150, an operation of selecting a variable gain amplification unit VGA1 (refer to FIG. 2) may be executed by bypassing the channel selection filter unit 350 (refer to FIG. 2). When the variation in the measured $SNR_{CURR}$ is in tolerance, it may mean that there is little external noise. Thus, the communication environment of the wireless communication device may be determined to be well established. In this case, a filtering operation of the channel selection filter unit 350 is not required. Since current consumption of the channel selection filter unit 350 is more than that of the variable gain amplification unit 352, it may be inefficient in terms of power management of a wireless communication device including the RF receiver 300. Thus, the channel selection filter unit 350 is bypassed in step S150, and the signal detours to the variable gain amplification unit 352. For example, this control operation may be accomplished by switching the switch 354 (refer to FIG. 2) in response to the second control signal CS2. For example, the second control signal CS2 may be generated from the modem 400 (refer to FIG. 1) or from a controller (not shown) connected to the modem 400.

In step S150, when the channel selection filter unit 350 is bypassed, the auxiliary variable gain amplifier 372 may be connected to an output terminal of the variable gain amplification unit 352 to amplify the output signal of the variable gain amplification unit 352. The auxiliary variable gain amplifier 372 may increase or decrease gain varied as the channel selection filter unit 350 is bypassed. The operation of connecting the auxiliary variable gain amplifier 372 is accomplished by switching the switch 370 (refer to FIG. 2) in response to the third control signal CS3. For example, the third control signal CS3 may be generated from the modem 400 or from a controller (not shown) connected to the modem 400.

In step S160, the current signal-to-noise ratio $SNR_{CURR}$ is compared with a reference signal-to-noise ratio $SNR_{REF}$ required by the wireless communication device. For example, this comparison may be executed by the modem 400 or by a controller (not shown) connected to the modem 400. The operation may therefore diverge according to whether the current signal-to-noise ratio $SNR_{CURR}$ is greater than the reference signal-to-noise ratio $SNR_{REF}$. When the current signal-to-noise ratio $SNR_{CURR}$ is greater than the reference signal-to-noise ratio $SNR_{REF}$ (step S160: Yes), the method ends. In other words, since the communication environment of the wireless communication device is well established, the method ends. Although not shown in FIG. 4, because the signal-to-noise ratio is continuously measured in real time, the method may return to step S110 for additional measurements rather than ending. When the current signal-to-noise ratio $SNR_{CURR}$ is less than the reference signal-to-noise ratio $SNR_{REF}$ (step S160: No), the method proceeds to step S170.

In step S170, the channel selection filter unit CSF is no longer bypassed (by operation of the switch 354 in response to the second control signal CS2), and the auxiliary variable gain amplifier 372 is bypassed (by operation of the switch 370 in response to the third control signal CS3). A determination that the current signal-to-noise ratio $SNR_{CURR}$ is less than the reference signal-to-noise ratio $SNR_{REF}$ (in step S160) may indicate that the communication environment of the wireless communication device is not satisfactorily established. Therefore, a filtering operation may be required, using the channel selection filter unit 350, which may be a low pass filter (LPF), for example.

In step S180, the transimpedance amplifier capacitor $C_{TIA}$ is electrically connected to the transimpedance amplifier 340. This determines whether the communication environment of the wireless communication device is well established, based on the measured variation of the SNR when the transimpedance amplifier capacitor $C_{TIA}$ is bypassed. The electrical connection between the transimpedance amplifier capacitor $C_{TIA}$ and the transimpedance amplifier 340 may be accomplished through a switching operation of a switch SW that operates in response to the first control signal CS1. For example, the first control signal CS1 may be generated from the modem 400 or from a controller (not shown) connected to the modem 400. FIG. 4 shows an example in which the transimpedance amplifier capacitor $C_{TIA}$ is electrically connected to the transimpedance amplifier 340 (step S180) after ending the bypassing of the channel selection filter unit 350 (step S170). However, embodiments of the inventive concept are not limited to this method. For example, such the operations indicated by steps S170 and S180 may be performed at the same time. Alternatively, the transimpedance amplifier capacitor $C_{TIA}$ may first be electrically connected to the transimpedance amplifier 340. After the transimpedance amplifier capacitor $C_{TIA}$ is electrically connected to the transimpedance amplifier 340, the method proceeds to step S120.

Returning to step S140, when the variation in the signal-to-noise ratio $SNR_{CURR}$ is not within tolerance, the method proceeds to step S180, in which the transimpedance amplifier capacitor $C_{TIA}$ is electrically connected to the transimpedance amplifier 340. This enables determination of whether the communication environment of the wireless communication device is well established, based on a measured variation in the SNR when the transimpedance amplifier capacitor $C_{TIA}$ is electrically disconnected from the transimpedance amplifier 340. Electrical disconnection between the transimpedance amplifier capacitor $C_{TIA}$ and the transimpedance amplifier 340 may be accomplished by switching the switch SW in the transimpedance amplifier capacitor unit 342, which operates in response to the first control signal CS1. For example, the first control signal CS1 may be generated from the modem 400 or from a controller (not shown) connected to the modem 400. After the transimpedance amplifier capacitor $C_{TIA}$ is electrically connected to the transimpedance amplifier TIA, the method proceeds to step S120.

As described above, a variation in SNR may be measured when the transimpedance amplifier capacitor $C_{TIA}$ is electrically connected to the transimpedance amplifier 340 and a variation in SNR may be measured when the transimpedance amplifier capacitor $C_{TIA}$ is electrically disconnected from the transimpedance amplifier 340. Whether the communication environment of the wireless communication device is well established may be determined based on the measurement results. When the variation is within tolerance, that is, when the communication environment of the wireless communication device is determined to be well established, the channel selection filter unit 350 may be bypassed, so the signal is diverted through the variable gain amplification unit 352. Thus, power consumption of the RF receiver 300 may be reduced. A decrease in signal gain owing to the bypassing operation may be compensated for by the auxiliary variable gain amplifier 372.

Figure 5:
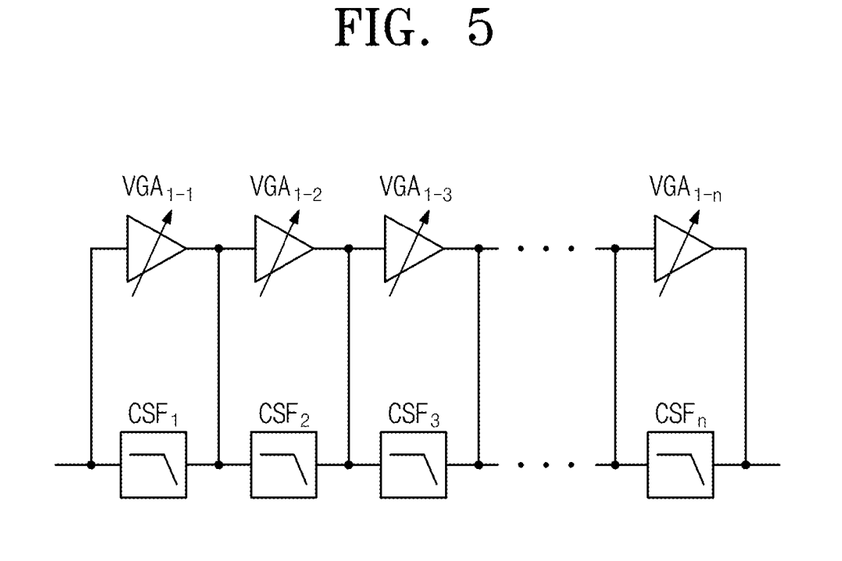
FIG. 5 is a diagram schematically illustrating a channel selection filter unit and a variable gain amplifier shown in FIG. 2, according to an embodiment of the inventive concept.

FIG. 5 is a diagram schematically illustrating a channel selection filter unit 350 and a variable gain amplification unit 352 shown in FIG. 2, according to an embodiment of the inventive concept. The channel selection filter unit 350 may include first to nth channel selection filters $CSF_1$ to $CSF_n$, and the variable gain amplification unit 352 may include first to nth variable gain amplifiers $VGA_{1-1}$ to $VGA_{1-n}$ (n being a natural number). Output terminals of an ith channel selection filter and an ith variable gain amplifier may be connected to output terminals of an (i+1)th channel selection filter and an (i+1)th variable gain amplifier (i being a natural number greater than or equal to 1 and less than n).

Figure 6:
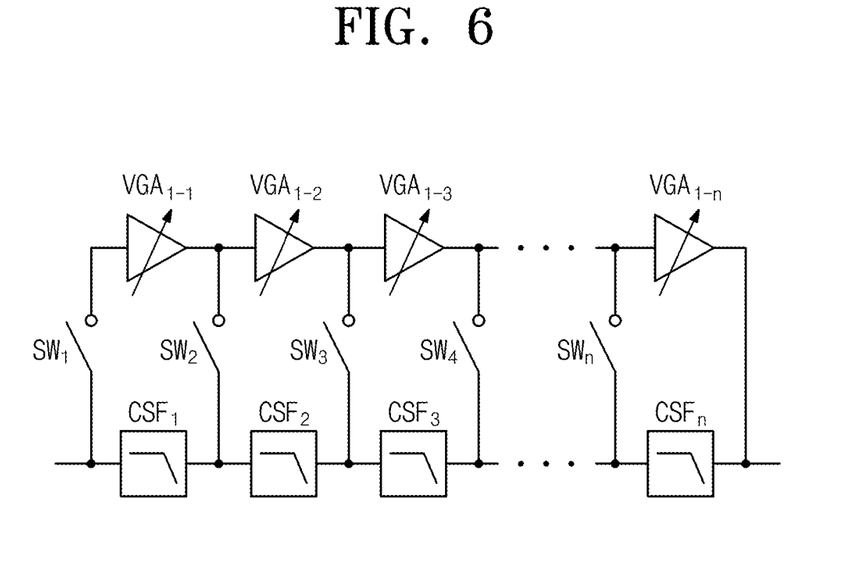
FIG. 6 is a diagram for describing an operation of operating a channel selection filter unit and a variable gain amplifier shown in FIG. 5, according to an embodiment of the inventive concept.

FIG. 6 is a diagram for describing operation of a channel selection filter unit CSF and a variable gain amplification unit VGA1 shown in FIG. 5, according to an embodiment of the inventive concept. Referring to FIG. 6, an ith switch $SW_i$ may be connected between an input terminal of an ith channel selection filter $CSF_i$ and an input terminal of an ith variable gain amplifier $VGA_{1-i}$ (i being a natural number greater than or equal to 1 and less than n), and an nth switch SWn may be connected between an input terminal of an nth channel selection filter $CSF_n$ and an input terminal of an nth variable gain amplifier $VGA_{1-n}$.

When a channel selection filter is bypassed by a switching operation, unintended noise may be generated on account of a rapid variation in voltage. A bypass operation may be performed from an nth channel selection filter $CSF_n$ to a first channel selection filter $CSF_1$ in an inverse order to minimize noise by switching. If an nth switch $SW_n$ is closed under the condition that all other switches are opened, only the nth channel selection filter $CSF_n$ is bypassed. In the event that the nth switch $SW_n$ is opened at the same time when an (n−1)th switch SWn−1 is closed, (n−1)th and nth channel selection filters CSFn−1 and $CSF_n$ may be bypassed. If a switching operation is performed in an inverse order, only the first switch $SW_1$ may be finally closed, and all channel selection filters $CSF_1$ to $CSF_n$ may be bypassed. As a result, unintended noise arising from a rapid variation in a voltage may be reduced because a gain slowly increased or decreased. Switching operations of the first to nth switches may be controlled by a second control signal CS2 generated by the modem 400 shown in FIG. 1 or a controller (not shown) connected to the modem 400.

Figure 7:
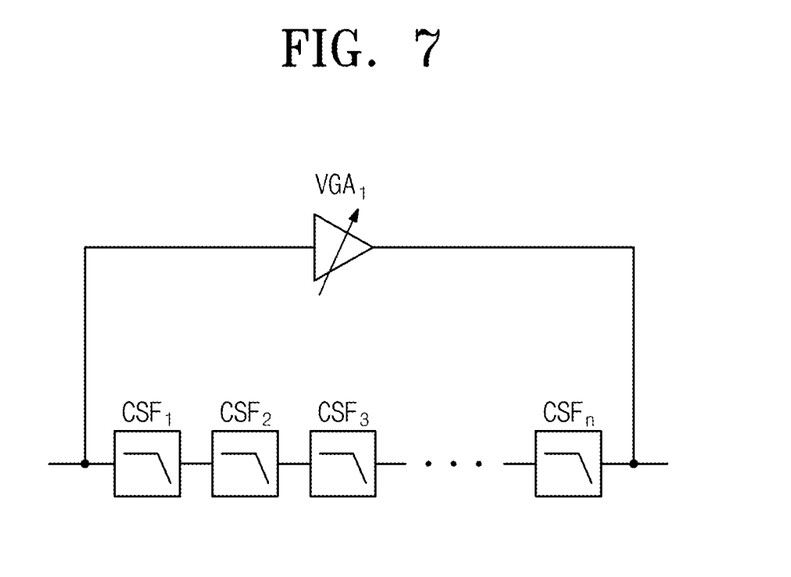
FIG. 7 is a diagram for describing an operation of operating a channel selection filter unit and a variable gain amplifier shown in FIG. 5, according to an embodiment of the inventive concept.

FIG. 7 is a diagram for describing operation of a channel selection filter unit CSF and a variable gain amplification unit VGA1 shown in FIG. 5, according to another embodiment of the inventive concept.

A channel selection filter unit CSF may include first to nth channel selection filters $CSF_1$ to $CSF_n$, and a variable gain amplification unit VGA1 may include a variable gain amplifier VGA1. An output terminal of an ith channel selection filter CSFi may be connected to an input terminal of an (i+1)th channel selection filter (i being a natural number greater than or equal to 1 and less than n). In an alternative configuration (not shown), the channel selection filter unit may include a channel selection filter, and the variable gain amplification unit may include first to nth variable gain amplifiers (n being a natural number). An output terminal of an ith variable gain amplifier (i being a natural number greater than or equal to 1 and less than n) is connected to an input terminal of a (i+1)th variable gain amplifier.

Figure 8:
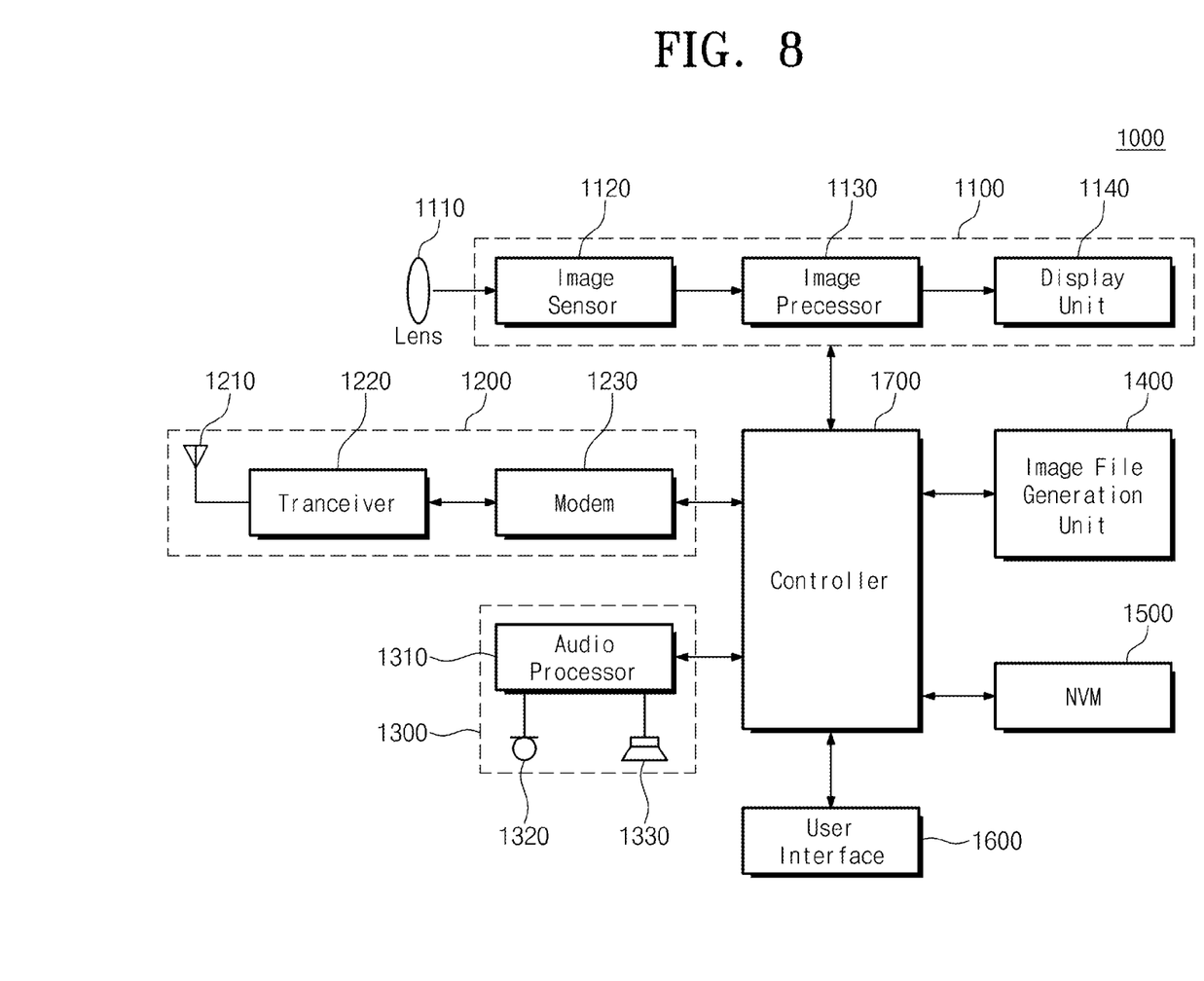
FIG. 8 is a block diagram schematically illustrating a handheld terminal to which a wireless communication device, according to an embodiment of the inventive concept, is applied.

FIG. 8 is a block diagram schematically illustrating a handheld terminal to which a wireless communication device, according to an embodiment of the inventive concept, is applied. Referring to FIG. 8, a handheld terminal 1000 includes an image processing unit 1100, a wireless transceiver unit 1200, an audio processing unit 1300, an image file generating unit 1400, a nonvolatile memory device 1500, a user interface 1600, and a controller 1700.

The image processing unit 1100 includes a lens 1110, an image sensor 1120, an image processor 1130, and a display unit 1140. The wireless transceiver unit 1200 includes an antenna 1210, a transceiver 1220, and a modem 1230. The audio processing unit 1300 includes an audio processor 1310, a microphone 1320, and a speaker 1330. The inventive concept may be described using an RF receiving device for purposes of illustration. However, the inventive concept may be applied to an RF transceiver, as well.

The nonvolatile memory device 1500 may be implemented by a memory card, for example, such as an MMC, eMMC, SD, micro SD, and the like. The controller 1700 may be implemented by a system on chip (SoC), for example, that drives an application program, an operating system, and so on. A kernel of an operating system driven on the system on chip may include an input/output scheduler and a device driver for controlling the nonvolatile memory device 1500. Based on the number of sync queues managed by the input/output scheduler, the device driver may control access performance of the nonvolatile memory device 1500 or a CPU mode and a Dynamic Voltage and Frequency Scaling (DVFS) level of the system on chip.

A nonvolatile memory device and/or a memory controller may be packaged according to any of a variety of different packaging technologies. Examples of packaging technologies include, but are not limited to, PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of operating a radio frequency (RF) receiver comprising a transimpedance amplifier, a capacitor selectively connected in parallel with the transimpedance amplifier, a channel selection filter unit connected to an output terminal of the transimpedance amplifier, and a variable gain amplification unit selectively connected in parallel with the channel selection filter unit, the method comprising:
measuring signal-to-noise ratio from an output of the RF receiver;
comparing the measured signal-to-noise ratio with a reference signal-to-noise ratio;
when the measured signal-to-noise ratio is greater than the reference signal-to-noise ratio, electrically disconnecting the capacitor from being connected in parallel with the transimpedance amplifier and measuring a variation in the measured signal-to-noise ratio; and
when the measured variation is in tolerance, bypassing the channel selection filter to select the variable gain amplification unit.

2. The method of claim 1, further comprising:
when the channel selection filter unit is bypassed, amplifying an output signal of the variable gain amplification unit using an auxiliary variable gain amplifier.

3. The method of claim 1, further comprising:
when the channel selection filter unit is bypassed, comparing the measured signal-to-noise ratio with the reference signal-to-noise ratio.

4. The method of claim 3, further comprising:
when the signal-to-noise ratio measured when the channel selection filter unit is bypassed is less than the reference signal-to-noise ratio, connecting the capacitor to be in parallel with the transimpedance amplifier and preventing the channel selection filter unit from being bypassed.

5. The method of claim 1, further comprising:
when the variation is not in tolerance, connecting the capacitor to be in parallel with the transimpedance amplifier.

6. The method of claim 1, wherein the channel selection filter unit comprises first to nth channel selection filters (n being a natural number) and the variable gain amplification unit comprises first to nth variable gain amplifiers, and
wherein output terminals of an ith channel selection filter and an ith variable gain amplifier (i being a natural number greater than or equal to 1 and less than n) are respectively connected to input terminals of a (i+1)th channel selection filter and a (i+1)th variable gain amplifier.

7. The method of claim 6, wherein when the channel selection filter unit is bypassed, a bypass operation is performed from the first variable gain amplifier to the nth variable gain amplifier in an inverse order.

8. The method of claim 1, wherein the channel selection filter unit comprises a channel selection filter and the variable gain amplification unit comprises first to nth variable gain amplifiers (n being a natural number), and
wherein an output terminal of an ith variable gain amplifier (i being a natural number greater than or equal to 1 and less than n) is connected to an input terminal of a (i+1)th variable gain amplifier.

9. The method of claim 1, wherein the channel selection filter unit comprises first to nth channel selection filters (n being a natural number) and the variable gain amplification unit comprises a variable gain amplifier, and
wherein an output terminal of an ith channel selection filter variable (i being a natural number greater than or equal to 1 and less than n) is connected to an input terminal of an (i+1)th channel selection filter.

10. The method of claim 1, wherein bypassing the channel selection filter unit is performed in response to a control signal from a modem connected to an output terminal of the RF receiver.

11. The method of claim 1, wherein electrically disconnecting the capacitor from being connected in parallel with the transimpedance amplifier is performed in response to a control signal from a modem connected to an output terminal of the RF receiver.

12. A wireless communication device, comprising:
a transimpedance amplifier configured to convert a current signal into a voltage signal;
a capacitor selectively connected in parallel with the transimpedance amplifier;
a channel selection filter unit configured to filter the voltage signal from the transimpedance amplifier;
a variable gain amplification unit selectively connected in parallel with the channel selection filter unit; and
a modem connected to an output terminal of the channel selection filter unit or to an output terminal of the variable gain amplification unit to measure signal-to-noise ratio,
wherein the modem generates a first control signal for electrically disconnecting the capacitor from the transimpedance amplifier when the signal-to-noise ratio is greater than a reference signal-to-noise ratio and a second control signal for bypassing the channel selection filter unit when a variation in the signal-to-noise ratio is within a predetermined range.

13. The wireless communication device of claim 12, further comprising:
an auxiliary variable gain amplifier connected between the channel selection filter unit and the modem and configured to amplify an output of the variable gain amplification unit when a variation in the signal-to-noise ratio is within the predetermined range.

14. The wireless communication device of claim 12, further comprising:
a switch connected to the capacitor and configured to be turned on or off under control of the first control signal, wherein the capacitor is electrically connected in parallel to the transimpedance amplifier when the switch is turned on and is electrically disconnected from the transimpedance amplifier when the switch is turned off.

15. The wireless communication device of claim 12, wherein the channel selection filter unit comprises first to nth channel selection filters (n being a natural number) and the variable gain amplification unit comprises first to nth variable gain amplifiers, and
wherein output terminals of an ith channel selection filter and an ith variable gain amplifier (i being a natural number greater than or equal to 1 and less than n) are respectively connected to input terminals of an (i+1)th channel selection filter and an (i+1)th variable gain amplifier, respectively.

16. The wireless communication device of claim 12, wherein the channel selection filter unit comprises a channel selection filter and the variable gain amplification unit comprises first to nth variable gain amplifiers (n being a natural number), and wherein an output terminal of an ith variable gain amplifier (i being a natural number greater than or equal to 1 and less than n) is connected to an input terminal of a (i+1)th variable gain amplifier.

17. The wireless communication device of claim 12, wherein the channel selection filter unit comprises first to nth channel selection filters (n being a natural number) and the variable gain amplification unit comprises a variable gain amplifier, and wherein an output terminal of an ith channel selection filter variable (i being a natural number greater than or equal to 1 and less than n) is connected to an input terminal of an (i+1)th channel selection filter.

18. A radio frequency (RF) receiver of a wireless communication device configured to receive an RF input signal from a filter and to output a data signal to a modem, the RF receiver comprising:

a transimpedance amplifier configured to convert a current signal from the RF input signal into a voltage signal;

a capacitor connectable in parallel with the transimpedance amplifier via a first switch;

a channel selection filter unit configured to filter the voltage signal from the transimpedance amplifier; and a variable gain amplification unit connectable in parallel with the channel selection filter unit via a second switch;

wherein the data signal is output from one of the channel selection filter unit or the variable gain amplification unit, enabling the modem to measure signal-to-noise ratio, and wherein the first switch receives a first control signal from the modem causing the first switch to electrically disconnect the capacitor from the transimpedance amplifier when the signal-to-noise ratio is greater than a reference signal-to-noise ratio, and the second switch receives a second control signal from the modem causing the channel selection filter unit to be bypassed when a variation in the signal-to-noise ratio is within a predetermined range.

19. The RF receiver of claim 18, wherein the variation in the signal-to-noise ratio is determined when the capacitor is not connected to the transimpedance amplifier.

20. The RF receiver of claim 19, further comprising:

an auxiliary variable gain amplifier configured to amplify an output of the variable gain amplification unit when the channel selection filter unit is bypassed.

* * * * *